United States Patent
Aoyagi et al.

(10) Patent No.: US 10,788,385 B2
(45) Date of Patent: Sep. 29, 2020

(54) PHYSICAL QUANTITY MEASUREMENT DEVICE, METHOD FOR MANUFACTURING SAME, AND PHYSICAL QUANTITY MEASUREMENT ELEMENT

(71) Applicant: Hitachi Automotive Systems, Ltd., Hitachinaka-shi, Ibaraki (JP)

(72) Inventors: Takuya Aoyagi, Tokyo (JP); Takashi Naitou, Tokyo (JP); Tatsuya Miyake, Tokyo (JP); Mizuki Shibata, Hitachinaka (JP); Hiroshi Onuki, Hitachinaka (JP); Daisuke Terada, Hitachinaka (JP); Shigenobu Komatsu, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 206 days.

(21) Appl. No.: 16/094,001

(22) PCT Filed: Apr. 13, 2017

(86) PCT No.: PCT/JP2017/015069
§ 371 (c)(1),
(2) Date: Oct. 16, 2018

(87) PCT Pub. No.: WO2017/203878
PCT Pub. Date: Nov. 30, 2017

(65) Prior Publication Data
US 2019/0128758 A1    May 2, 2019

(30) Foreign Application Priority Data
May 27, 2016    (JP) .................................. 2016-106378

(51) Int. Cl.
*G01L 9/00* (2006.01)
*G01L 19/00* (2006.01)
(Continued)

(52) U.S. Cl.
CPC ............ *G01L 9/0048* (2013.01); *G01D 21/00* (2013.01); *G01L 9/00* (2013.01); *H01L 24/29* (2013.01);
(Continued)

(58) Field of Classification Search
CPC ......... G01D 21/00; G01L 9/00; G01L 9/0048; G01L 19/00; G01L 19/04; H01L 21/58;
(Continued)

(56) References Cited

U.S. PATENT DOCUMENTS

2007/0138650 A1* 6/2007 Ito ........................... H01L 24/83
                                                                    257/779
2010/0219487 A1* 9/2010 Donis ..................... H01L 24/29
                                                                    257/414
(Continued)

FOREIGN PATENT DOCUMENTS

| CN | 103547206 A | 1/2014 |
| CN | 103648999 A | 3/2014 |

(Continued)

OTHER PUBLICATIONS

Chinese-language Office Action issued in Chinese Application No. 201780022928.1 dated Jan. 22, 2020 (seven (7) pages).
(Continued)

*Primary Examiner* — Nguyen Q. Ha
(74) *Attorney, Agent, or Firm* — Crowell & Moring LLP

(57) ABSTRACT

Provided is a physical quantity measurement device in which a bonding temperature of a bonding layer is lowered to a temperature not affecting an operation of a semiconductor chip and an insulating property of the semiconductor chip and a base is secured. The physical quantity measurement device includes a base (diaphragm), a semiconductor chip (strain detection element) to measure a physical quantity on the basis of stress acting on the base, and a bonding
(Continued)

layer to bond the semiconductor chip to the base. The bonding layer has a first bonding layer bonded to the semiconductor chip, a second bonding layer bonded to the base, and an insulating base material disposed between the first bonding layer and the second bonding layer. The first and second bonding layers and contain glass. A thermal expansion coefficient of the first bonding layer is equal to or lower than a thermal expansion coefficient of the second bonding layer, a softening point of the second bonding layer is equal to or lower than a heat resistant temperature of the semiconductor chip, and a softening point of the first bonding layer is equal to or lower than the softening point of the second bonding layer.

12 Claims, 6 Drawing Sheets

(51) Int. Cl.
*G01L 19/04* (2006.01)
*H01L 21/58* (2006.01)
*G01D 21/00* (2006.01)
*H01L 29/84* (2006.01)
*H01L 23/00* (2006.01)

(52) U.S. Cl.
CPC .............. *H01L 24/30* (2013.01); *H01L 24/33* (2013.01); *H01L 24/83* (2013.01); *H01L 29/84* (2013.01); *H01L 2224/29188* (2013.01); *H01L 2224/30505* (2013.01); *H01L 2224/8389* (2013.01)

(58) Field of Classification Search
CPC ......... H01L 24/29; H01L 24/30; H01L 24/33; H01L 24/83; H01L 24/84; H01L 2224/29188; H01L 2224/30505; H01L 2224/8389
See application file for complete search history.

(56) References Cited

U.S. PATENT DOCUMENTS

| 2014/0058201 A1 | 2/2014 | Mizuyoshi |
| 2014/0145122 A1 | 5/2014 | Sawai et al. |
| 2015/0270508 A1 | 9/2015 | Naito et al. |
| 2017/0038269 A1 | 2/2017 | Hio et al. |

FOREIGN PATENT DOCUMENTS

| CN | 104823519 A | 8/2015 | |
| DE | 10036284 A1 * | 2/2002 | |
| JP | 2014-235106 A | 12/2014 | |
| WO | WO 2015/040737 A1 | 3/2015 | |
| WO | WO 2015/098324 A1 | 7/2015 | |
| WO | WO-2015107453 A1 * | 7/2015 | ............ G01L 9/0072 |

OTHER PUBLICATIONS

International Search Report (PCT/ISA/210) issued in PCT Application No. PCT/JP2017/015069 dated Jun. 13, 2017 with English translation (three pages).
Japanese-language Written Opinion (PCT/ISA/237) issued in PCT Application No. PCT/JP2017/015069 dated Jun. 13, 2017 (three pages).

* cited by examiner

PHYSICAL QUANTITY MEASUREMENT DEVICE, METHOD FOR MANUFACTURING SAME, AND PHYSICAL QUANTITY MEASUREMENT ELEMENT

TECHNICAL FIELD

The present invention relates to a physical quantity measurement device for measuring a physical quantity such as a pressure, a method for manufacturing the same, and a physical quantity measurement element.

BACKGROUND ART

As an example of a conventional physical quantity measurement device, a pressure measurement device that is mounted on various apparatuses of measurement targets and measures a pressure is known (refer to the following PTL 1). The pressure measurement device described in PTL 1 includes a metal casing and a strain detection element. The metal casing has a pressure introduction unit and a diaphragm deformed by the pressure introduced from the pressure introduction unit. The strain detection element detects the strain generated in the diaphragm.

The pressure measurement device has a base made of a first brittle material on the metal casing. In the pressure measurement device, the strain detection element is bonded to the base via a second brittle material having a lower melting point than the base. PTL 1 describes that the above configuration is adopted, so that a pressure detection element having high bonding reliability between a diaphragm made of a metal material having a higher thermal expansion coefficient than silicon or glass and a strain detection element can be provided.

As another example of the physical quantity measurement device, the invention that relates to a pressure sensor in which a sensor element is glass-bonded to a diaphragm of a metal stem and a method for manufacturing the same is disclosed (refer to the following PTL 2). The pressure sensor described in PTL 2 includes a metal stem, bonding glass, and a sensor element.

The metal stem has a shape of a hollow cylinder provided with pressure introduction holes into which a pressure medium is introduced and has a diaphragm provided at one end of the hollow cylindrical shape to close one of the pressure introduction holes. The diaphragm is strained by the pressure of the pressure medium introduced into the pressure introduction hole.

The bonding glass is provided on the side of one end of the metal stem opposite to the pressure introduction hole in the diaphragm. The sensor element is bonded to the diaphragm via the bonding glass and outputs a sensor signal according to the strain of the diaphragm. The pressure sensor described in PTL 2 is characterized by the following configuration.

The metal stem has a convex portion provided at one end of the metal stem to protrude from a reference surface on which the bonding glass is disposed in the diaphragm. The convex portion is located around the bonding glass at one end of the metal stem. A height of the convex portion is at least 20% larger than a thickness of the bonding glass with the reference surface as a reference.

PTL 2 describes that the above configuration is adopted, so that a position of the bonding glass with respect to the diaphragm is regulated by the convex portion, a positional deviation of the bonding glass with respect to the diaphragm can be prevented, and a positional deviation of the sensor element with respect to the diaphragm of the metal stem can be prevented.

CITATION LIST

Patent Literature

PTL 1: WO 2015/098324
PTL 2: JP 2014-235106 A

SUMMARY OF INVENTION

Technical Problem

In the pressure measurement device described in PTL 1, glass paste is applied as a fundamental base to the diaphragm and a glass plate is mounted as a top base on the fundamental base and sintered, thereby forming a base made of two-layer brittle materials (refer to the same literature, paragraph 0039, etc.). When the glass paste is used, there is a problem in that it is necessary to manage viscosity and preprocessing such as pre-baking is necessary. In addition, because the glass paste is generally applied by printing such as screen printing, there is a problem in that it is difficult to apply the glass paste to a portion other than a flat surface.

On the other hand, PTL 2 describes that solid tablet glass formed with granular glass is disposed on a reference surface, a sensor element is disposed on the tablet glass, the tablet glass is baked to form bonding glass, and the sensor element is bonded to the diaphragm via the bonding glass (refer to the same literature, paragraphs 0013 and 0014, etc.). As a result, it is not necessary to perform printing and the sensor element can be fixed to the portion other than the flat surface.

In PTL 2, for example, low melting-point glass that can be baked at 430° C. is used as the tablet glass (refer to the same literature, paragraph 0037). Generally, glass containing a large amount of lead, bismuth, or vanadium is known as the low melting-point glass. However, in the conventional physical quantity measurement device, when the low melting-point glass is used as a bonding layer for bonding the base such as the diaphragm and the semiconductor chip to measure a physical quantity such as a pressure acting on the base, there are the following problems.

For example, when glass containing a large amount of bismuth is used as the bonding layer, a bonding temperature becomes higher than that of glass containing a large amount of lead or vanadium, which may adversely affect an operation of the semiconductor chip. In addition, if glass containing a large amount of lead is used as the bonding layer, an environmental problem such as the RoHS directive may occur. In addition, if glass containing a large amount of vanadium is used as the bonding layer, the bonding layer has electrical conductivity, insulation between the semiconductor chip and the base becomes insufficient, and noise may increase.

The present invention has been made in view of the above problems and it is an object of the present invention to provide a physical quantity measurement device capable of improving bonding reliability between a base and a semiconductor chip and reliability of an operation of the semiconductor chip, a method for manufacturing the same, and a physical quantity measurement element.

Solution to Problem

To achieve the above object, a physical quantity measurement device according to the present invention is a physical quantity measurement device that includes a base, a semiconductor chip to measure a physical quantity on the basis of stress acting on the base, and a bonding layer to bond the semiconductor chip to the base. The bonding layer has a first bonding layer bonded to the semiconductor chip, a second bonding layer bonded to the base, and an insulating base material disposed between the first bonding layer and the second bonding layer, the first and second bonding layers contain glass, a thermal expansion coefficient of the first bonding layer is equal to or lower than a thermal expansion coefficient of the second bonding layer, a softening point of the first bonding layer is equal to or lower than a heat resistant temperature of the semiconductor chip, and a softening point of the second bonding layer is equal to or lower than the softening point of the first bonding layer.

Advantageous Effects of Invention

According to the present invention, a physical quantity measurement device capable of improving bonding reliability between a base and a semiconductor chip and reliability of an operation of the semiconductor chip, a method for manufacturing the same, and a physical quantity measurement element can be provided.

DESCRIPTION OF EMBODIMENTS

Hereinafter, embodiments of a physical quantity measurement device and a physical quantity measurement element according to the present invention will be described with reference to the drawings.

(Physical Quantity Measurement Device and Physical Quantity Measurement Element)

Figure 1:
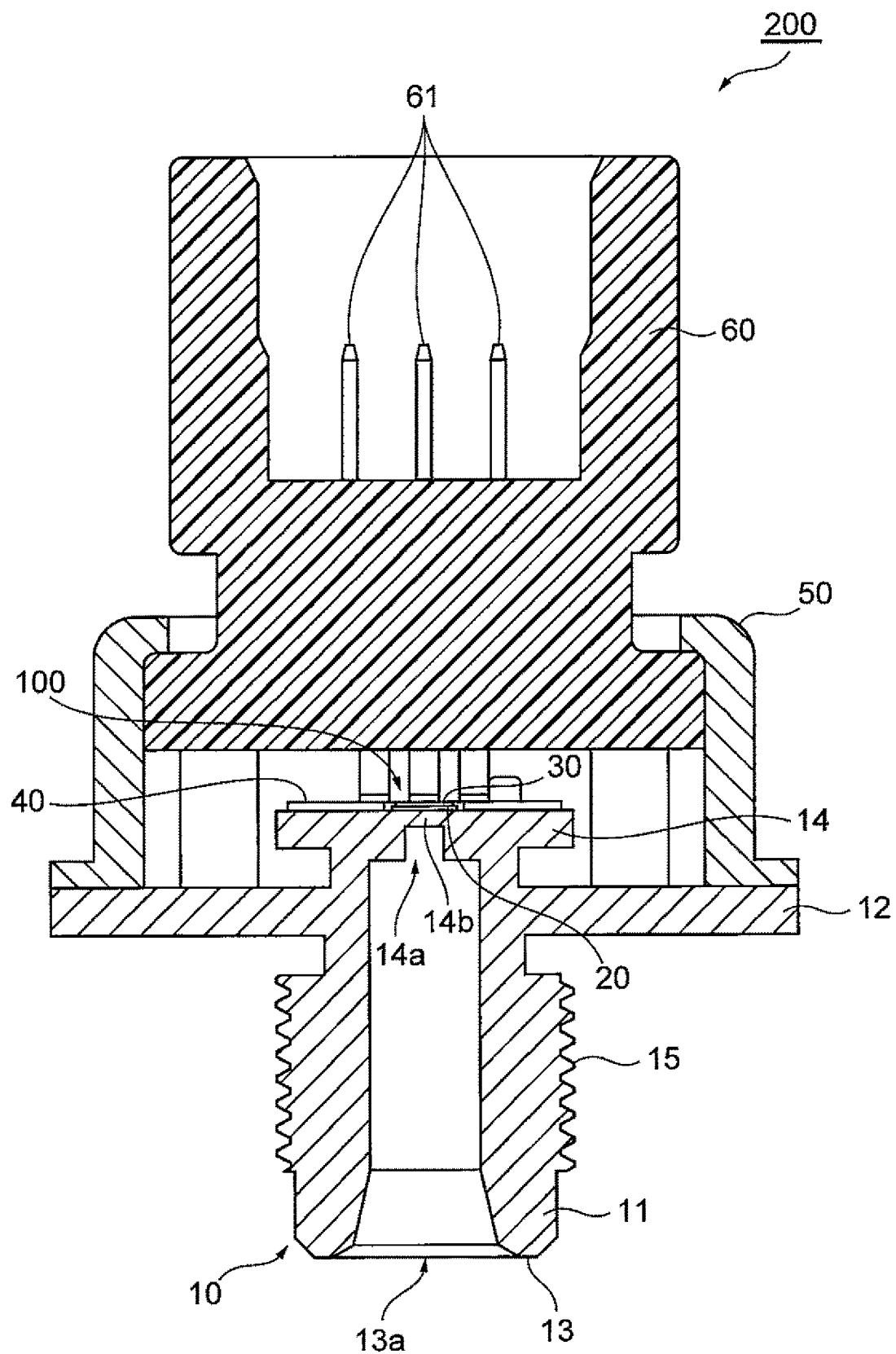
FIG. 1 is a schematic cross-sectional view showing an embodiment of a physical quantity measurement device according to the present invention.

FIG. 1 is a schematic cross-sectional view showing an embodiment of a physical quantity measurement device 200 and a physical quantity measurement element 100 according to the present invention.

The physical quantity measurement device 200 shown in FIG. 1 is, for example, a pressure measurement device mounted on a vehicle and measuring a pressure such as an engine fuel pressure, a brake hydraulic pressure, and various gas pressures as a physical quantity. That is, the physical quantity measurement device 200 according to this embodiment includes a pressure measurement element for measuring a pressure as the physical quantity measurement element 100. The physical quantity measurement device and the physical quantity measurement element according to the present invention are not limited to the pressure measurement device and the pressure measurement element and include various devices and elements for measuring a physical quantity such as a mass, an acceleration, a force, and a pressure, for example, on the basis of the stress acting on a base.

The physical quantity measurement device 200 according to this embodiment includes, for example, a metal casing 10, a strain detection element 30 fixed to the metal casing 10 via a bonding layer 20, a substrate 40 connected to the strain detection element 30, a cover 50 covering the substrate 40 and the strain detection element 30, and a connector 60 fixed to the cover 50, as shown in FIG. 1. The physical quantity measurement element 100 used in the physical quantity measurement device 200 according to this embodiment includes the bonding layer 20 and the strain detection element 30.

The metal casing 10 includes a hollow cylindrical pressure port 11 and a flange portion 12 protruding in a radial direction from outer circumference of the pressure port 11. One end of the pressure port 11 in an axial direction is a pressure introduction portion 13 opened by a pressure introduction port 13a and the other end in the axial direction is closed by an end wall 14. An outer circumferential surface of the pressure port 11 between the flange portion 12 and the pressure introduction port 13a is provided with a screw thread 15 that fastens and fixes the physical quantity measurement device 200 to a pipe or the like through which a fluid of a measurement target to measure a physical quantity such as a pressure flows.

In the end wall 14 of the pressure port 11, for example, a rectangular recessed portion 14a is formed in a center portion of an inner wall surface and a rectangular diaphragm 14b is formed in a bottom portion of the recessed portion 14a. The diaphragm 14b is a thin portion provided in the bottom portion of the recessed portion 14a of the end wall 14 and is deformed by the pressure of the fluid introduced into the pressure port 11 and causes a strain difference of an X direction and a Y direction orthogonal to each other. The strain detection element 30 is bonded to a portion of the outer wall surface of the end wall 14 corresponding to the diaphragm 14b via the bonding layer 20.

The flange portion 12 is, for example, a circular plate-like portion connected to the outer circumferential surface of the pressure port 11 and protruding in the radial direction of the pressure port 11. A peripheral edge portion of the flange portion 12 is bonded to a lower end of the cover 50 by welding to form a space for accommodating the strain detection element 30 and the substrate 40 with the cover 50 and the connector 60.

The strain detection element 30 is bonded to substantially a center portion of the outer wall surface of the end wall 14 of the pressure port 11 to be a sensor mounting surface. The strain detection element 30 is a semiconductor chip including one or more strain resistance bridges to output an electrical signal according to the deformation of the diaphragm 14b of the metal casing 10, that is, the strain on a silicon chip.

That is, in the physical quantity measurement device 200 according to this embodiment, the end wall 14 of the pressure port 11 of the metal casing 10 is a base to bond the strain detection element 30 to be the semiconductor chip via the bonding layer 20. In other words, the physical quantity measurement device 200 and the physical quantity measurement element 100 according to this embodiment detect the strain of the diaphragm 14b functioning as the base by the strain detection element 30 functioning as the semiconductor chip and measure the pressure to be the physical quantity of the fluid introduced into the pressure port 11, on the basis of the stress acting on the diaphragm 14*b* functioning as the base.

The physical quantity measurement device 200 and the physical quantity measurement element 100 according to this embodiment are characterized by the bonding layer 20 for bonding the strain detection element 30 to be the semiconductor chip to the end wall 14 to be the base. Details of the bonding layer 20 will be described later.

The substrate 40 is fixed to a portion of the end wall 14 of the pressure port 11 of the metal casing 10 excluding the center portion of the outer wall surface and is connected to the strain detection element 30 fixed to the center portion of the outer wall surface via the bonding layer 20 by means of wire bonding. On the substrate 40, for example, an amplifier to amplify each detection signal output from the strain detection element 30, an A/D converter to convert an analog output signal of the amplifier into a digital signal, a digital signal operation processing circuit to perform a correction operation to be described later, on the basis of the digital signal, a memory storing various data, a capacitor, and the like are mounted.

The cover 50 is a cylindrical member that has substantially circular openings at one end and the other end in the axial direction and has an outer shape of an intermediate portion in the axial direction to be a hexagonal bolt shape. An opening edge of a lower end of the cover 50 is bent radially outward, contacts a top surface of the outer edge portion of the flange portion 12 of the metal casing 10, and is bonded to the outer edge portion of the flange portion 12 by welding. An opening edge of an upper end of the cover 50 is caulked radially inward and is fixed to a part of the connector 60 inserted into the cover 50 from the opening of the upper end of the cover 50.

The connector 60 is made of a resin, for example, is integrated by insert molding, and has metal needle-like terminals 61 connected to the substrate. The connector 60 has three terminals 61 for a power supply, a ground, and a signal output, for example. The physical quantity measurement device 200 is connected such that the connector 60 is connected to an end connector of a wiring line not shown in the drawings to output a signal of the measured physical quantity to an electronic control unit (ECU) of a vehicle.

Figure 2:
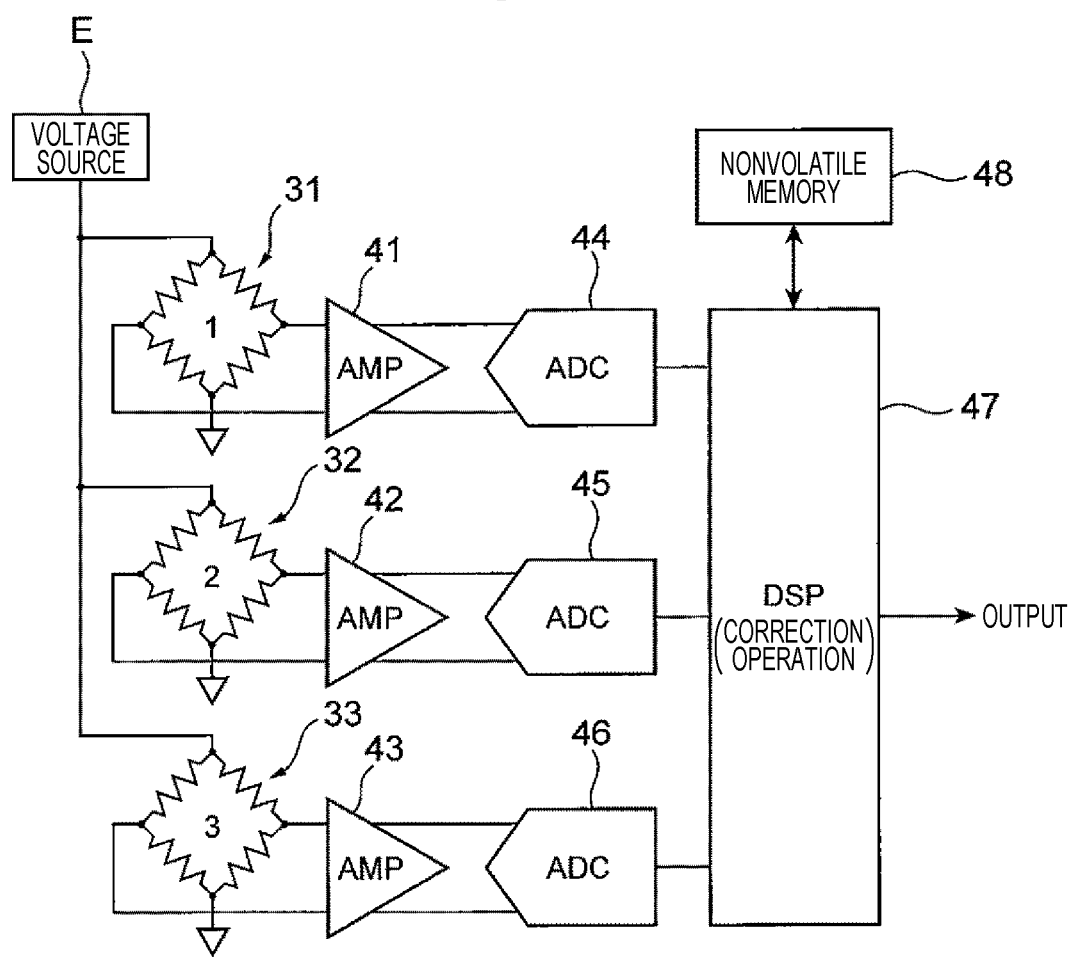
FIG. 2 is a circuit diagram of the physical quantity measurement device shown in FIG. 1.

FIG. 2 is a circuit diagram of the physical quantity measurement device 200 shown in FIG. 1.

The strain detection element 30 includes, for example, a plurality of strain resistance bridges 31, 32, and 33. The substrate 40 includes, for example, a plurality of amplifiers 41, 42, and 43 to amplify output signals of the respective strain resistance bridges 31, 32, and 33, analog/digital (A/D) converters 44, 45, and 46 to perform A/D conversion on outputs of the amplifiers 41, 42, and 43, a digital signal processor (DSP) 47 functioning as a digital signal operation processing circuit, and a nonvolatile memory 48.

Each of the strain resistance bridges 31, 32, and 33 is configured by bridge-connecting a strain gauge which is strained according to deformation of the diaphragm 14*b* of the end wall 14 of the metal casing 10 to be the base and of which a resistance value changes. The output signals of the strain resistance bridges 31, 32, and 33, that is, bridge signals based on the stress acting on the diaphragm 14*b* due to the pressure introduced into the pressure port 11 are amplified by the amplifiers 41, 42, and 43 and are converted into digital signals by the A/D converters 44, 45, and 46. Power is supplied from a voltage source E to the strain resistance bridges 31, 32, and 33 via the terminals 61 of the connector 60.

The DSP 47 corrects an output signal on the basis of the output signals of the strain resistance bridges 31, 32, and 33 output from the A/D converters 44, 45, and 46 and outputs a physical quantity based on the corrected output signal as a measurement value of the physical quantity measurement device 200 and the physical quantity measurement element 100. More specifically, for example, operation processing for correcting the output signal of one strain resistance bridge 31 by the output signals of the other strain resistance bridges 32 and 33 is performed and a pressure value based on the corrected output signal is output as a measurement value The correction operation may be performed by an analog circuit instead of the DSP 47.

The DSP 47 is not limited to the correction operation processing described above and performs comparison of the output values of the plurality of strain resistance bridges 31, 32, and 33 or comparison of the output values of the strain resistance bridges 31, 32, and 33 and an output value in a prescribed pressure value previously stored in the nonvolatile memory 48 and determines degradation of a measurement target apparatus or the strain detection element 30. The DSP 47 also performs processing such as outputting a failure signal, for example, at the time of determining the degradation of the measurement target apparatus or the strain detection element 30. A signal is output from the DSP 47 via the terminal 61 of the connector 60.

In the nonvolatile memory 48, for example, when a fluid of a known pressure is introduced into the pressure port 11, the output values of the strain resistance bridges 31, 32, and 33 are previously stored. The nonvolatile memory 48 may be mounted on a circuit chip different from other circuit components.

Hereinafter, the bonding layer 20 that is a characteristic portion of the physical quantity measurement device 200 and the physical quantity measurement element 100 according to this embodiment will be described in detail.

Figure 3:
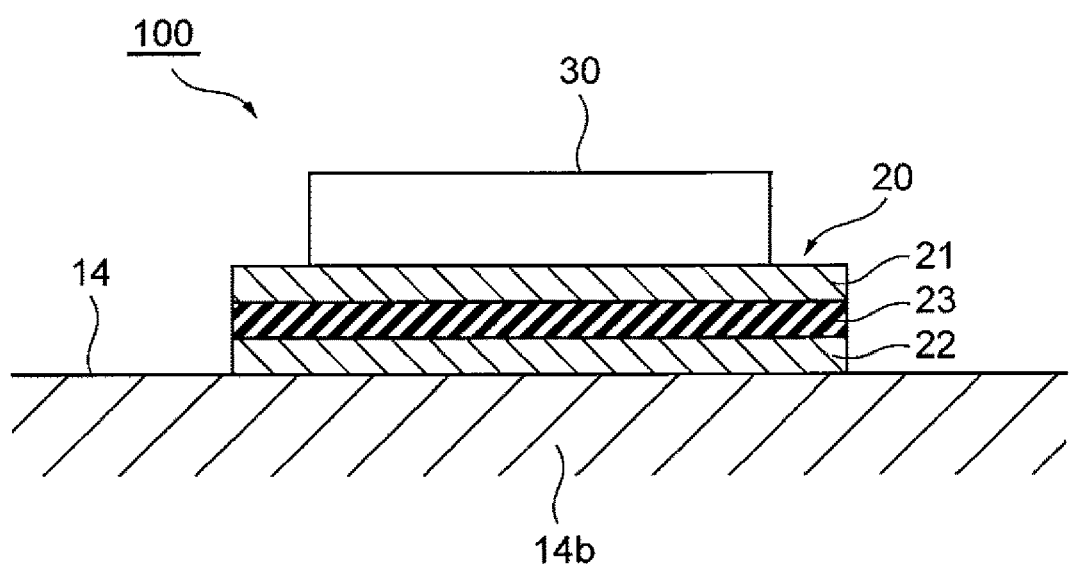
FIG. 3 is an enlarged cross-sectional view of the vicinity of a bonding layer of the physical quantity measurement device shown in FIG. 1.

FIG. 3 is an enlarged cross-sectional view of the vicinity of the bonding layer 20 of the physical quantity measurement device 200 and the physical quantity measurement element 100 shown in FIG. 1.

As described above, the physical quantity measurement device 200 according to this embodiment includes the end wall 14 of the metal casing 10 to be the base, the strain detection element 30 to be a semiconductor chip to measure a physical quantity on the basis of the stress acting on the base, and the bonding layer 20 to bond the semiconductor chip to the base. Similarly, the physical quantity measurement element 100 according to this embodiment includes the strain detection element 30 to be a semiconductor chip to measure a physical quantity, on the basis of the stress acting on the base, and the bonding layer 20 to bond the semiconductor chip to the base.

The bonding layer 20 has a first bonding layer 21 bonded to the strain detection element 30 to be the semiconductor chip, a second bonding layer 22 bonded to the end wall 14 of the metal casing 10 to be the base, and an insulating base material 23 disposed between the first bonding layer 21 and the second bonding layer 22. The physical quantity measurement device 200 and the physical quantity measurement element 100 according to this embodiment are characterized by that the first bonding layer 21 and the second bonding layer 22 contain glass, a thermal expansion coefficient of the first bonding layer 21 is equal to or lower than a thermal expansion coefficient of the second bonding layer 22, a softening point of the first bonding layer 21 is equal to or lower than a heat resistant temperature of semiconductor chip, and a softening point of the second bonding layer 22 is equal to or lower than a softening point of the first bonding layer 21.

Here, as a material of the metal casing 10, for example, stainless steel such as SUS630 or SUS430 can be adopted because corrosion resistance and high strength to withstand a high pressure are required including the end wall 14 functioning as the base. As a material of the strain detection element 30 functioning as the semiconductor chip, for example, silicon can be used. A thermal expansion coefficient of silicon is, for example, $37 \times 10^{-7}/°$ C. and a thermal expansion coefficient of the stainless steel is, for example, $113 \times 10^{-7}/°$ C. Therefore, a bonding failure due to a difference of the thermal expansion coefficients becomes a problem between the end wall 14 of the metal casing 10 functioning as the base and the strain detection element 30 functioning as the semiconductor chip. Here, the thermal expansion coefficient is a thermal expansion coefficient in a temperature range of 50° C. to 250° C.

Therefore, when the thermal expansion coefficient of the strain detection element 30 to be the semiconductor chip is set to α1, a thermal expansion coefficient of the first bonding layer 21 is set to α2, a thermal expansion coefficient of the insulating base material 23 is set to α3, a thermal expansion coefficient of the second bonding layer 22 is set to α4, and a thermal expansion coefficient of the metal casing 10 functioning as the base is set to α5, a relation of α1<α2<α3<α4<α5 is preferably satisfied. In other words, preferably, the thermal expansion coefficient of the bonding layer 20 is set to a value between the thermal expansion coefficients of the semiconductor chip and the base to be bonded via the bonding layer 20 and the thermal expansion coefficient of the bonding layer 20 gradually decreases from the side of the base having a higher thermal expansion coefficient to the side of the semiconductor chip having a lower thermal expansion coefficient. As a result, the thermal expansion coefficient of the first bonding layer 21 becomes equal to or lower than the thermal expansion coefficient of the second bonding layer 22, thermal stress due to a difference of the thermal expansion coefficients between the end wall 14 of the metal casing 10 functioning as the base and the strain detection element 30 functioning as the semiconductor chip can be efficiently alleviated, a bonding failure between the base and the semiconductor chip can be suppressed, and stability and reliability of bonding can be improved.

Hereinafter, a composition of the glass contained in the first bonding layer 21 and the second bonding layer 22 is exemplified.

As the composition of the glass contained in the first bonding layer 21 and the second bonding layer 22, for example, a glass composition containing $V_2O_5$ and $TeO_2$ as main components or a glass composition containing PbO as a main component can be used. That is, the glass contained in the first bonding layer 21 and the second bonding layer 22 may contain vanadium (V). Here, the main component of the glass composition means a component having the largest content, in terms of oxides.

The first bonding layer 21 and the second bonding layer 22 contain vanadium, so that the glass contained in the first bonding layer 21 and the second bonding layer 22 can be configured by low melting-point glass having a melting point of 400° C. or less with an unleaded glass composition from environmental consideration. As a result, the softening points of the first bonding layer 21 and the second bonding layer 22 are set to a temperature equal to or lower than the heat resistant temperature of the strain detection element 30 to be the semiconductor chip, so that the strain detection element 30 can be bonded to the end wall 14 of the metal casing 10 to be the base via the bonding layer 20. Here, the unleaded glass composition includes a composition containing a prohibited substance in the RoHS (Restriction of Hazardous Substances) directive within a range of a regulated value or less. In addition, the heat resistant temperature of the strain detection element 30 that is the semiconductor chip is, for example, 430° C. or less.

The glass contained in the first bonding layer 21 can contain, for example, $V_2O_5$ of 40 to 50 wt %, $TeO_2$ of 20 to 30 wt %, $P_2O_5$ of 5.8 to 15 wt %, $Fe_2O_3$ of 0 to 15 wt %, $WO_3$ of to 10 wt %, and ZnO of 0 to 10 wt %, in terms of oxides. In addition, the glass preferably contains $Fe_2O_3$ of 10 wt % or more. By containing $Fe_2O_3$ of 10 wt % or more, it is possible to lower a softening point of the glass while lowering a thermal expansion coefficient of the glass containing $V_2O_5$ as a main component. By containing $Fe_2O_3$ of 10 wt % or more, the glass composition is easily crystallized. However, $WO_3$ is contained within a range of 0 to 10 wt %, so that the crystallization can be suppressed. In addition, ZnO is added, so that adhesion with $SiO_2$-based glass can be improved.

The glass contained in the second bonding layer 22 can contain $V_2O_5$ of 37.2 to 50 wt %, $TeO_2$ of 20 to 30 wt %, $P_2O_5$ of 0 to 15 wt %, $Fe_2O_3$ of 0 to 15 wt %, $WO_3$ of 0 to 10 wt %, BaO of 0 to 26 wt %, and ZnO of 0 to 10 wt %, in terms of oxides. In addition, the glass may contain alkali metal oxides such as $K_2O$ and $Cs_2O$ as other components, within a range of 0 to 5 wt %. The first bonding layer 21 and the second bonding layer 22 can be formed using glass paste, for example.

Figure 4:
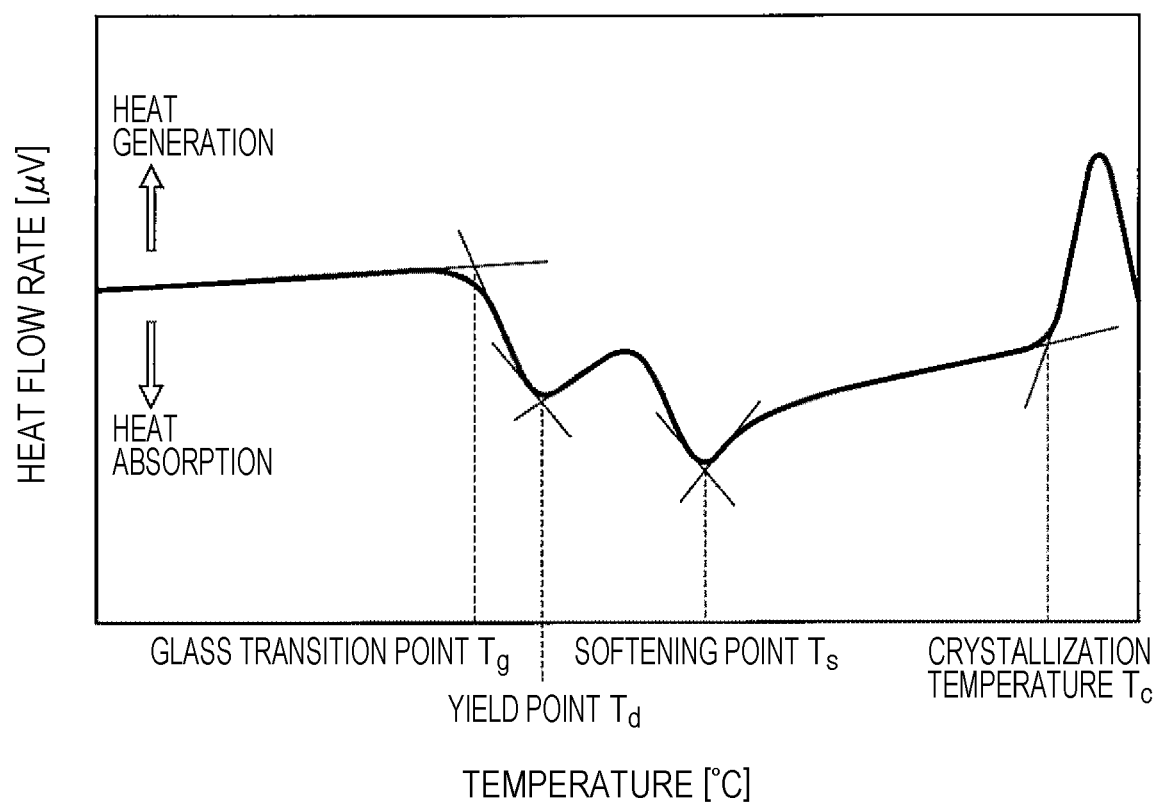
FIG. 4 is a graph showing an example of a representative DTA curve of glass.

FIG. 4 is a graph showing an example of a representative DTA curve of glass.

Characteristic temperatures such as a glass transition temperature Tg, a yield point Td, a softening point Ts, and a crystallization temperature Tc of the glass contained in the first bonding layer 21 and the second bonding layer 22 can be obtained by differential thermal analysis (DTA), for example. For example, as shown in FIG. 4, the softening point Ts of the glass is a second heat absorption peak in the DTA curve.

The first bonding layer 21 and the second bonding layer 22 can contain a filler material having a lower thermal expansion coefficient than the glass contained in the first bonding layer 21 and the second bonding layer 22, for example. In this case, a content of the filler material of the first bonding layer 21 is set to be higher than a content of the filler material of the second bonding layer 22. As a result, the thermal expansion coefficient of the first bonding layer 21 bonded to the strain detection element 30 functioning as the semiconductor chip can be set to be lower than the thermal expansion coefficient of the second bonding layer 22 bonded to the metal casing 10 functioning as the base.

As the filler material, for example, zircon, zirconia, quartz glass, β-spodumene, cordierite, mullite, eucryptite, β-quartz, zirconium phosphate, zirconium phosphate tungstate (ZWP), zirconium tungstate, a solid solution of these materials, or the like can be used or one or two or more kinds of these materials can be combined and used.

The content of the filler material in the first bonding layer 21 is, for example, 30 vol % to 40 vol %, more preferably, 35 vol %, to 40 vol %. In addition, the content of the filler material in the second bonding layer 22 is not particularly limited as long as it is smaller than the content of the filler material in the first bonding layer 21. As a result, the thermal expansion coefficients of the first bonding layer 21 and the second bonding layer 22 can be adjusted to thermal expansion coefficients suitable for bonding the semiconductor chip and the base having a large difference in the thermal expansion coefficients, as described above.

The thermal expansion coefficient of the first bonding layer 21 can be adjusted to, for example, $42\times10^{-7}/°$ C. to $62\times10^{-7}/°$ C., more preferably, $42\times10^{-7}/°$ C. to $50\times10^{-7}/°$ C. As a result, the bonding layer 20 excellent in a bonding state and bonding reliability with the semiconductor chip can be obtained and a physical quantity measurement device with high measurement precision can be provided.

The thermal expansion coefficient of the second bonding layer 22 can be adjusted to, for example, $42\times10^{-7}/°$ C. to $113\times10^{-7}/°$ C., more preferably, $67\times10^{-7}/°$ C. to $102\times10^{-7}/°$ C. As a result, the bonding layer 20 excellent in a bonding state and bonding reliability with the base can be obtained and a physical quantity measurement device with high measurement precision can be provided.

The insulating base material 23 is not particularly limited as long as it is a material having an electrical insulating property. However, as the insulating base material 23, for example, a general high-resistance material such as glass, silicon, and alumina can be used. The glass used as the insulating base material 23 is, for example, high-resistance glass containing $SiO_2$ as a main component. Volume resistivity of the insulating base material 23 is preferably, for example, $10^{10}$ Ωcm or more.

The bonding layer 20 has the insulating base material with the insulating property to block electric noise from the metal casing 10 to be the base of the physical quantity measurement device 200 to the strain detection element 30 to be the semiconductor chip and noise included in the output of the strain detection element 30 can be suppressed. In addition, the insulating base material 23 is preferably unleaded due to the regulation in the RoHS directive.

The thermal expansion coefficient of the insulating base material 23 is, for example, $38\times10^{-7}/°$ C. to $100\times10^{-7}/°$ C. Thereby, bonding reliability between the insulating base material 23 and the first bonding layer 21 and the second bonding layer 22 can be improved. However, from a relation with the thermal expansion coefficients of the first bonding layer 21 and the second bonding layer 22, the thermal expansion coefficient of the insulating base material 23 is preferably $66\times10^{-7}/°$ C. to $84\times10^{-7}/°$ C.

In addition, if a thickness of the insulating base material 23 is, for example, 5 μm to 500 μm, securing of insulation reliability and suppression of noise can be realized. However, from the viewpoint of improvement of insulation reliability, further suppression of noise, and thinning of the insulating layer, the thickness of the insulating base material 23 is preferably 20 μm to 100 μm.

In addition, each of the end wall 14 of the metal casing 10 to be the base and the strain detection element 30 to be the semiconductor chip preferably has a metal film containing at least one selected from the group consisting of Al, Ni, Ti, and Mo, on a surface to which the bonding layer 20 is bonded. As such, by performing a metallization treatment for forming the metal film containing the metal element on the surface to which the bonding layer 20 is bonded, a compound is formed between the glass and the metal film contained in the first bonding layer 21 and the second bonding layer 22 and bonding stability between the semiconductor chip and the base and the bonding layer 20 can be improved. A method for forming the metal film on the surface to which the bonding layer 20 is bonded by performing the metallization treatment is not particularly limited. For example, a plating method, a sputtering method, or an evaporation method can be used.

As described above, the physical quantity measurement device 200 according to this embodiment includes the end wall 14 of the metal casing 10 to be the base, the strain detection element 30 to be the semiconductor chip to measure the physical quantity on the basis of the stress acting on the base, and the bonding layer 20 to bond the semiconductor chip to the base. Similarly, the physical quantity measurement element 100 according to this embodiment includes the strain detection element 30 to be a semiconductor chip to measure a physical quantity, on the basis of the stress acting on the base, and the bonding layer 20 to bond the semiconductor chip to the base.

In the physical quantity measurement device 200 and the physical quantity measurement element 100 according to this embodiment, the bonding layer 20 has the first bonding layer 21 bonded to the strain detection element 30 to be the semiconductor chip, the second bonding layer 22 bonded to the end wall 14 of the metal casing 10 to be the base, and the insulating base material 23 disposed between the first bonding layer 21 and the second bonding layer 22. In addition, the first bonding layer 21 and the second bonding layer 22 contain the glass, the thermal expansion coefficient of the first bonding layer 21 is equal to or lower than the thermal expansion coefficient of the second bonding layer 22, the softening point of the first bonding layer 21 is equal to or lower than the heat resistant temperature of the semiconductor chip, and the softening point of the second bonding layer 22 is equal to or lower than the softening point of the first bonding layer 21.

As such, because the thermal expansion coefficient of the first bonding layer 21 is equal to or lower than the thermal expansion coefficient of the second bonding layer 22, so that the stress due to the difference in the thermal expansion coefficients between the base made of a metal and the semiconductor chip made of silicon can be alleviated and bonding reliability between the base and the semiconductor chip can be improved. In addition, the softening point of the first bonding layer 21 is equal to or lower than the heat resistant temperature of the semiconductor chip and the softening point of the second bonding layer 22 is equal to or lower than the softening point of the first bonding layer 21, so that the bonding temperature of the bonding layer 20 can be lowered to a temperature not affecting the operation of the semiconductor chip. Even when the first bonding layer 21 and the second bonding layer 22 have conductivity, the insulating property of the semiconductor chip and the base is secured by the insulating base material 23 and noise with respect to the input and output of the semiconductor chip can be reduced.

In addition, because the semiconductor chip can be bonded to the base using the bonding layer 20 to be the solid, it is not necessary to use a printing method when the semiconductor chip is bonded to the base, constraint conditions in the base to be a mounting surface of the semiconductor chip are released, and bonding reliability can be improved. Furthermore, when the softening point of the second bonding layer 22 is lower than the softening point of the first bonding layer 21 by, for example, 7° C. or more, it is possible to reduce warping of the bonding layer 20 and improve bonding reliability.

As described above, according to this embodiment, the physical quantity measurement device 200 and the physical quantity measurement element 100 capable of improving bonding reliability between the base and the semiconductor chip and reliability of an operation of the semiconductor chip can be provided.

(Method for Manufacturing Physical Quantity Measurement Device)

Next, an embodiment of a method for manufacturing the physical quantity measurement device according to the present invention will be described.

Figure 5:
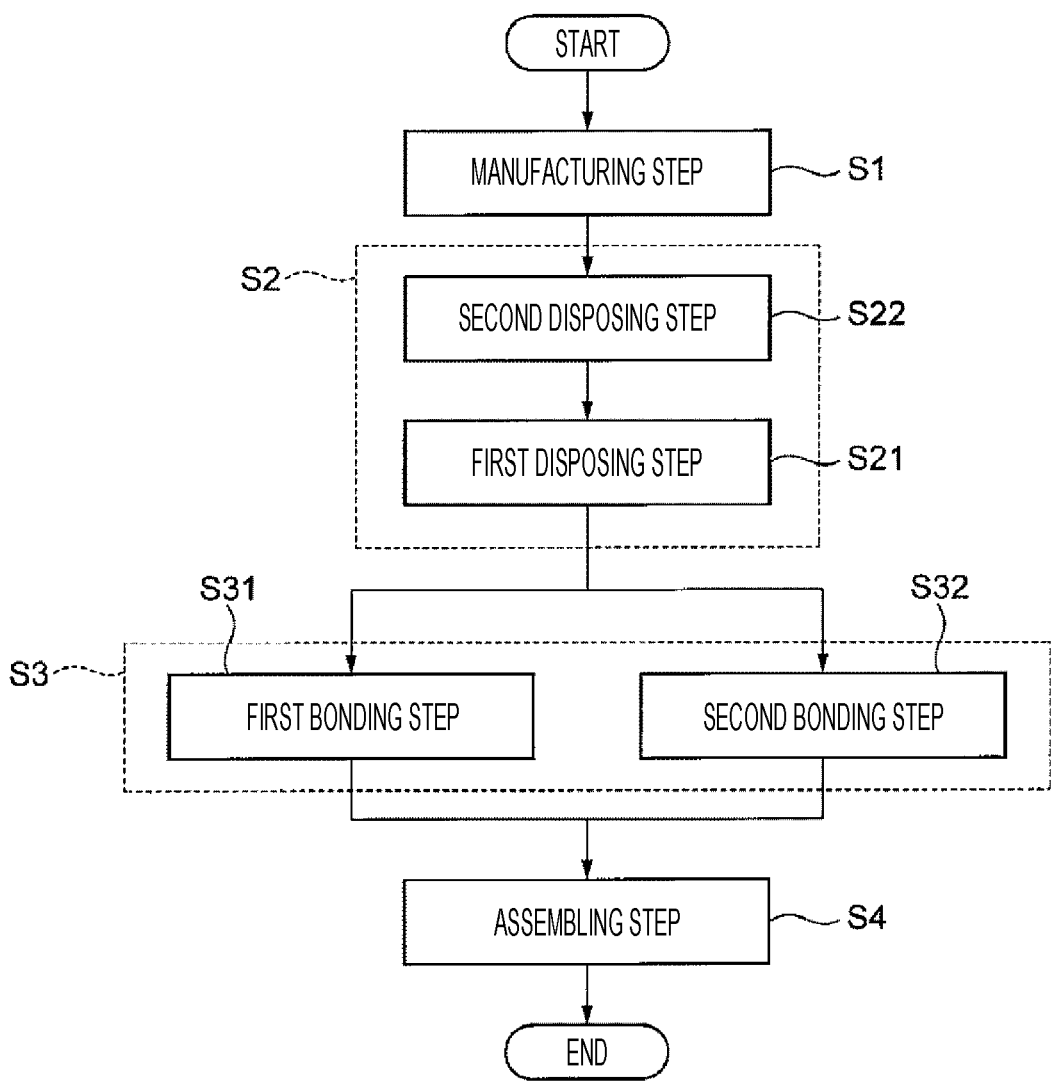
FIG. 5 is a flow diagram showing an example of a method for manufacturing the physical quantity measurement device according to this embodiment.

FIG. 5 is a flow diagram showing an example of a method for manufacturing the physical quantity measurement device 200 according to this embodiment shown in FIG. 1. The method for manufacturing the physical quantity measurement device 200 according to this embodiment has, for example, a manufacturing step S1 of manufacturing components, a disposing step S2 of disposing the bonding layer 20, a bonding step S3 of bonding the strain detection element 30 to be the semiconductor chip to the metal casing to be the base by the bonding layer 20, and an assembling step S4 of assembling the components.

In the manufacturing step S1, for example, the components configuring the physical quantity measurement device 200 such as the metal casing 10, the bonding layer 20, the strain detection element 30, the substrate 40, the cover 50, and the connector 60 are manufactured. The components other than the bonding layer 20 can be manufactured in the same manner as the conventional case. The bonding layer 20 can be manufactured by applying the glass paste for forming the first bonding layer 21 and the second bonding layer 22 to the insulating base material 23 and baking the glass paste.

More specifically, to manufacture the bonding layer 20, after the glass paste for forming the first bonding layer 21 is applied to one surface of the insulating base material 23 and dried, the glass paste for forming the second bonding layer 22 is applied to the other surface of the insulating base material 23 and dried. As the glass paste, for example, a resultant obtained by kneading glass powder, a filler material, a solvent, and a binder can be used.

The glass used for the glass paste can be manufactured by charging a raw material obtained by blending and mixing oxides corresponding to the composition of the glass into a platinum crucible, heating it to 800 to 1100° C. at a temperature rise rate of 5 to 10° C./min. in an electric furnace, and maintaining the temperature over several hours. While the raw material is heated and the temperature is maintained, it is desirable to perform stirring for uniform Glass. When the crucible is extracted from the electric furnace and the glass is extracted from the crucible, to prevent moisture from being adsorbed onto a Glass surface, it is desirable to pour the glass into a graphite mold or a stainless plate previously heated to about 100 to 150° C.

As the solvent used for the glass paste, for example, butyl carbitol acetate or α-terpineol can be used. As the binder used for the glass paste, for example, ethyl cellulose, nitrocellulose, or the like can be used.

Next, a binder elimination treatment and pre-baking of the glass paste applied to both surfaces of the insulating base material 23 are performed and the glass paste is cut to a desired size, so that the bonding layer in which the first bonding layer 21 and the second bonding layer 22 have been pre-baked can be obtained. By the above manufacturing method, mass production of the bonding layer 20 can be performed and a manufacturing cost can be reduced.

In the manufacturing step S1, the binder elimination treatment and the pre-baking of the glass paste applied to the insulating base material 23 may be omitted. In this case, in the bonding step S3 to be described later, the binder elimination treatment, the pre-baking, and the main baking of the glass paste applied to the insulating base material 23 are performed, so that the first bonding layer 21 and the second bonding layer 22 can be formed.

In the disposing step S2, first, a second disposing step S22 of disposing the bonding layer 20 with the second bonding layer 22 facing the center portion provided with the diaphragm 14b of the end wall 14 of the metal casing 10 to be the base is performed. Then, a first disposing step S21 of disposing the strain detection element 30 to be the semiconductor chip to face the first bonding layer 21 of the bonding layer 20 disposed on the end wall 14 of the metal casing 10 to be the base is performed. After the first disposing step S21 of disposing the strain detection element 30 to be the semiconductor chip to face the first bonding layer 21 of the bonding layer 20, the second disposing step S22 of disposing the second bonding layer 22 of the bonding layer 20 to face the end wall 14 of the metal casing 10 to be the base may be performed.

In the bonding step S3, for example, after the first disposing step S21 and the second disposing step S22 are performed to dispose the bonding layer 20 between the semiconductor chip and the base, a first bonding step S31 and a second bonding step S32 are performed. In the first bonding step S31, the bonding layer 20 is heated to a temperature equal to or higher than the softening point of the first bonding layer 21 and equal to or lower than the heat resistant temperature of the semiconductor chip, so that the semiconductor chip and the bonding layer 20 are bonded to each other via the first bonding layer 21. In the second bonding step S32, the bonding layer 20 is heated to a temperature equal to or higher than the softening point of the second bonding layer 22 and equal to or lower than the heat resistant temperature of the semiconductor chip, so that the base and the bonding layer 20 are bonded to each other via the second bonding layer 22. In the manufacturing method according to this embodiment, because the softening point of the second bonding layer 22 is equal to or lower than the softening point of the first bonding layer 21, the bonding layer 20 is heated to the temperature equal to or higher than the softening point of the first bonding layer 21 and equal to or lower than the heat resistant temperature of the semiconductor chip and the first bonding step S31 and the second bonding step S32 can be performed collectively.

In the assembling step S4, the substrate 40 is fixed to the end wall 14 of the metal casing 10 to which the strain detection element 30 to be the semiconductor chip has been bonded via the bonding layer 20 and a terminal of the strain detection element 30 and a terminal of the substrate 40 are connected by wire bonding, for example. In addition, the connector 60 is fixed to the cover 50, the terminal 61 of the connector 60 is connected to the terminal of the substrate 40, and the cover 50 and the flange portion 12 of the metal casing 10 are bonded by welding, for example. As described above, the physical quantity measurement device 200 according to this embodiment can be manufactured.

According to the method for manufacturing the physical quantity measurement device 200 according to this embodiment, the thermal expansion coefficient of the first bonding layer 21 is equal to or lower than the thermal expansion coefficient of the second bonding layer 22, so that the stress due to the difference in the thermal expansion coefficients between the base and the semiconductor chip can be alleviated and bonding reliability between the base and the semiconductor chip can be improved. In addition, the softening point of the first bonding layer 21 is equal to or lower than the heat resistant temperature of the semiconductor chip and the softening point of the second bonding layer 22 is equal to or lower than the softening point of the first bonding layer 21, so that the bonding temperature of the bonding layer 20 can be lowered to a temperature not affecting the operation of the semiconductor chip. Even when the first bonding layer 21 and the second bonding layer 22 have conductivity, the insulating property of the semiconductor chip and the base is secured by the insulating base material 23 and noise with respect to the input and output of the semiconductor chip can be reduced.

In addition, because the semiconductor chip can be bonded to the base using the bonding layer 20 to be the solid, it is not necessary to use the printing method when the semiconductor chip is bonded to the base, the constraint conditions such as the shape of the base to be the mounting surface of the semiconductor chip are released, and bonding reliability can be improved. Furthermore, when the softening point of the second bonding layer 22 is lower than the softening point of the first bonding layer 21 by, for example, 7° C. or more, it is possible to reduce warping of the bonding layer 20 and improve bonding reliability.

Figure 6:
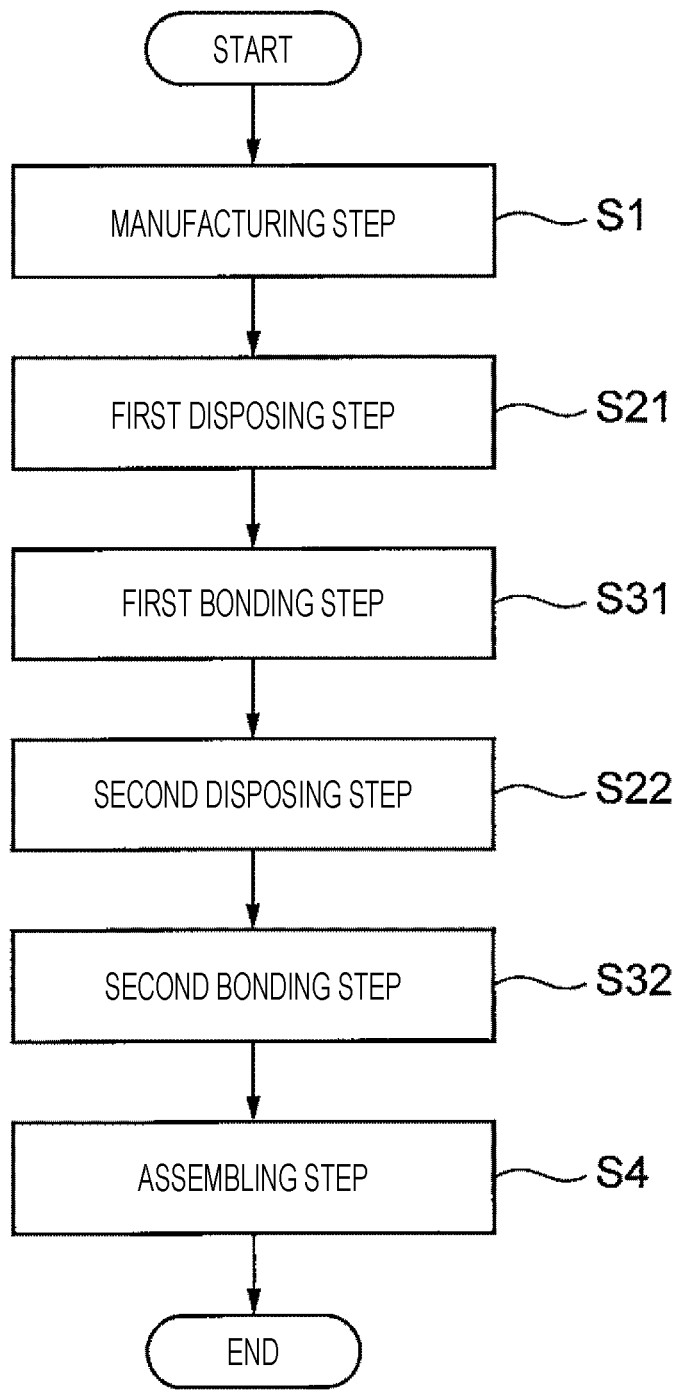
FIG. 6 is a flow diagram showing a modification of the method for manufacturing the physical quantity measurement device shown in FIG. 5.

FIG. 6 is a flow diagram showing a modification of the method for manufacturing the physical quantity measurement device 200 shown in FIG. 5. The method for manufacturing the physical quantity measurement device according to the present invention is not limited to the embodiment shown in FIG. 5 and can be performed by an embodiment shown in FIG. 6.

In the embodiment shown in FIG. 5, the case where, after the first disposing step S21 and the second disposing step S22 are performed to dispose the bonding layer 20 between the semiconductor chip and the base, the bonding layer 20 is heated to the temperature equal to or higher than the softening point of the first bonding layer 21 and equal to or lower than the heat resistant temperature of the semiconductor chip and the first bonding step S31 and the second bonding step S32 are collectively performed has been described.

On the other hand, in the embodiment shown in FIG. 6, after the manufacturing step S1, the first disposing step S21 of disposing the semiconductor chip and the first bonding layer 21 of the bonding layer 20 to face each other is performed. Next, the first bonding step S31 for heating the bonding layer 20 to a temperature equal to or higher than the softening point of the first bonding layer 21 and equal to or lower than the heat resistant temperature of the semiconductor chip and bonding the semiconductor chip and the bonding layer 20 to each other via the first bonding layer 21 is performed. As a result, as shown in FIG. 3, it is possible to manufacture the physical quantity measurement element 100 including the strain detection element 30 to be the semiconductor chip and the bonding layer 20.

Next, the second disposing step S22 of disposing the base and the second bonding layer 22 of the bonding layer to face each other is performed. Next, the second bonding step S32 for heating the bonding layer 20 to a temperature equal to or higher than the softening point of the second bonding layer 22 and equal to or lower than the heat resistant temperature of the semiconductor chip and bonding the base and the bonding layer 29 to each other via the second bonding layer 22 is performed. At this time, because the softening point of the second bonding layer 22 is lower than the softening point of the first bonding layer 21, the bonding layer 20 can be bonded to the base via the second bonding layer 22 while bonding between the first bonding layer 21 and the semiconductor chip is maintained.

Therefore, according to the embodiment shown in FIG. 6, the same effect as the embodiment shown in FIG. 5 can be obtained, the bonding layer 20 and the semiconductor chip can be easily disposed on the base, and bonding precision can be improved.

Although the embodiment of the present invention has been described in detail using the drawings, the specific configuration is not limited to this embodiment and even if there are design changes and the like within the scope not departing from the gist of the present invention, these are included in the present invention.

EXAMPLES AND COMPARATIVE EXAMPLES

Hereinafter, physical quantity measurement devices according to examples of the present invention and physical quantity measurement devices according to comparative examples not included in the present invention will be described.

Using vanadium pentoxide, tellurium oxide, ferric oxide, phosphorus pentoxide, tungsten oxide, barium carbonate, antimony oxide, barium phosphate, potassium carbonate, bismuth oxide, boron oxide, zinc oxide, and copper oxide as raw materials of glasses, glasses G1 to G13 having the compositions shown in the following table 1 are manufactured. In the glass compositions shown in Table 1, all components are represented by mass % in terms of oxides.

TABLE 1

| Glass No. | Glass composition (mass %) | | | | | | | | | | | | |
|---|---|---|---|---|---|---|---|---|---|---|---|---|---|
| | $V_2O_5$ | $TeO_5$ | $Fe_2O_3$ | $P_2O_5$ | $WO_3$ | $BaO$ | $Sb_2O_3$ | $Cs_2O$ | $K_2O$ | $Bi_2O_3$ | $B_2O_3$ | $ZnO$ | $CuO$ |
| G1 | 25 | — | — | 25 | 40 | — | — | — | — | — | — | 10 | — |
| G2 | 50 | — | — | 25 | — | 5 | 20 | — | — | — | — | — | — |
| G3 | 50 | — | — | 24.1 | — | 25.9 | — | — | — | — | — | — | — |
| G4 | 45 | 30 | 15 | 10 | — | — | — | — | — | — | — | — | — |
| G5 | 47 | 30 | 10 | 13 | — | — | — | — | — | — | — | — | — |
| G6 | 47 | 30 | 7 | 10 | 5 | — | — | — | — | — | — | 1 | — |
| G7 | 38 | 30 | — | 5.8 | 10 | 11.2 | — | — | 5 | — | — | — | — |
| G8 | — | — | 0.4 | — | — | 3.4 | — | — | — | 76.8 | 8.1 | 6.3 | 5 |
| G9 | 50 | 20 | 10 | 15 | 5 | — | — | — | — | — | — | — | — |
| G10 | 45 | 29 | 5 | 10.3 | 5 | 4.7 | — | 1 | — | — | — | — | — |
| G11 | 40 | 30 | — | 4.8 | 10 | 15.2 | — | — | — | — | — | — | — |
| G12 | 37.2 | 38 | — | — | — | 18.6 | — | — | — | — | — | 6.2 | — |
| G13 | 40 | 30 | — | 7.4 | 10 | 2.6 | — | — | — | — | — | 10 | — |

The glasses G1 to G13 are manufactured by the following procedure. First, mixed powder of 1 kg obtained by blending and mixing the raw materials to have the composition shown in Table 1 is charged into a platinum crucible and is heated to a heating temperature of 1000 to 1200° C. at a temperature rise rate of 5 to 10° C./min. using an electric furnace and the heating temperature is maintained for 2 hours. While the heating temperature is maintained, stirring is performed for uniform glass. Next, the platinum crucible is extracted from the electric furnace, the molten glass is poured on a stainless plate previously heated to 100° C., and the glasses G1 to G13 are obtained.

Next, glass paste to form the first bonding layer and the second bonding layer of the bonding layer is manufactured. Specifically, first, the glasses G1 to G13 are pulverized individually using a jet mill until an average particle diameter (D50) become about 3 µm and powders of the glasses G1 to G13 are obtained. In addition, $Zr_2(WO_4)(RO_4)_2$ (hereinafter, it may be abbreviated as ZWP) having an average particle diameter (D50) of about 3 µm, cordierite (hereinafter, it may be abbreviated as CRD), or aluminum (Al) is added as a filler material to the obtained powders of the glasses G1 to G13 by a predetermined amount to obtain mixed powder.

Next, ethyl cellulose is added as a binder to the mixed powder to which the powders of the glasses G1 to G13 or the filler material had been added, butyl carbitol acetate is added as a solvent and kneaded, and the glass paste is manufactured. Next, thin plate glass having a thickness of 30 µm and a thermal expansion coefficient of $66 \times 10^{-7}$/° C. is prepared as the insulating base material of the bonding layer. Next, after the glass paste is applied to one surface of the insulating base material by screen printing and dried at a temperature of 150° C. for 30 minutes, the glass paste is similarly applied to the other surface of the insulating base material and dried.

Then, as the binder elimination treatment, the insulating base material to which the glass paste has been applied is heated at 330° C. for 30 minutes. Next, the insulating base material to which the glass paste has been applied is pre-backed at the same temperature as the bonding temperature of the bonding layer, so that the bonding layers according to the example and the comparative example having the first bonding layer bonded to the semiconductor chip, the second bonding layer bonded to the base, and the insulating base material disposed between the first bonding layer and the second bonding layer are obtained. The thickness of each obtained bonding layer is about 90 µm.

The following Table 2 shows types and contents (vol %) of glasses contained, types and contents (vol %) of filler materials contained, thermal expansion coefficients [$10^{-7}$/° C.], and softening points [° C.], for a first bonding layer and a second bonding layer of each of bonding layers according to examples E1 to E18. In Table 2, the types of the glasses are shown by glass No. shown in Table 1.

In addition, the following Table 3 shows types and contents (yolk) of glasses contained, types and contents (vol %) of filler materials contained, thermal expansion coefficients [$10^{-7}$/° C.], and softening points [° C.], for a first bonding layer and a second bonding layer of each of bonding layers according to comparative examples C1 to C18. In Table 3, the types of the glasses are shown by glass No. shown in Table 1.

The thermal expansion coefficients of the first bonding layer and the second bonding layer of each of the bonding layers shown in Tables 2 and 3 are measured as follows. First, after glass powder containing no binder and solvent or mixed powder of glass powder and a filler material is uniaxially pressed, the glass powder or the mixed powder is minutely baked in an electric furnace and cut to obtain test pieces. Dimensions of the test pieces are 4 mm×4 mm×15 mm. Thermal expansion coefficients in a range of 50 to 250° C. are measured using the test pieces and a push rod type thermomechanical analyzer.

In addition, softening points of the first bonding layer and the second bonding layer of each of the bonding layers shown in Tables 2 and 3 are obtained as follows. First, differential thermal analysis (DTA) is performed on the glass powder or the mixed powder at a temperature rise rate of 5° C./rain. Alumina powder is used as a standard sample. In an obtained DTA curve, a second heat absorption peak temperature is taken as a softening point Ts.

Next, a semiconductor chip (4 mm×mm, $37 \times 10^{-7}$/° C.) in which an Al film is formed by performing a metallization treatment on a bonding surface is prepared as the semiconductor chip used for the physical quantity measurement device. A diaphragm (φ2 mm and thermal expansion coefficient: $113 \times 10^{-7}$/° C.) made of stainless steel (SUS630) is prepared as the base for bonding the semiconductor chip via the bonding layer.

Using the bonding layers according to the examples E1 to E18 and the comparative examples C1 to C11, the first bonding step and the second bonding step described in the embodiment are performed, the first bonding layer of each bonding layer is caused to face the bonding surface of the semiconductor chip, the second bonding layer of each bonding layer is caused to face the bonding surface of the base, and the bonding layer is disposed between the semiconductor chip and the base. Next, each bonding layer is heated to a temperature bonding temperature equal to or higher than the softening point of the first bonding layer and the semiconductor chip is bonded to the base via the bonding layer.

Evaluation results of a bonding temperature, adhesion propriety, reliability, and a chip operation of the bonding layer of each of the examples E1 to E18 are shown in the following Table 4. In addition, evaluation results of a bonding temperature, adhesion propriety, reliability, and a chip operation of the bonding layer of each of the comparative examples C1 to C11 are shown in the following Table 5.

TABLE 2

| Example | Configuration | Glass Type | Glass Content [vol %] | Filler material Type | Filler material Content [vol %] | Thermal expansion coefficient [$10^{-7}$/° C.] | Softening point [° C.] |
|---|---|---|---|---|---|---|---|
| E1 | First bonding layer | G4 | 60 | ZWP | 40 | 43 | 383 |
|  | Second bonding layer | G5 | 90 | ZWP | 10 | 89 | 365 |
| E2 | First bonding layer | G4 | 65 | ZWP | 35 | 47 | 382 |
|  | Second bonding layer | G5 | 90 | ZWP | 10 | 89 | 365 |
| E3 | First bonding layer | G4 | 70 | ZWP | 30 | 56 | 381 |
|  | Second bonding layer | G5 | 90 | ZWP | 10 | 89 | 365 |
| E4 | First bonding layer | G4 | 75 | ZWP | 25 | 62 | 381 |
|  | Second bonding layer | G5 | 90 | ZWP | 10 | 89 | 365 |
| E5 | First bonding layer | G5 | 70 | ZWP | 30 | 60 | 366 |
|  | Second bonding layer | G5 | 90 | ZWP | 10 | 89 | 365 |

TABLE 2-continued

| Example | Configuration | Glass Type | Content [vol %] | Filler material Type | Content [vol %] | Thermal expansion coefficient [$10^{-7}/°C$] | Softening point [°C] |
|---|---|---|---|---|---|---|---|
| E6 | First bonding layer | G5 | 65 | ZWP | 35 | 52 | 367 |
|  | Second bonding layer | G5 | 90 | ZWP | 10 | 89 | 365 |
| E7 | First bonding layer | G6 | 60 | ZWP | 40 | 42 | 361 |
|  | Second bonding layer | G7 | 70 | ZWP | 30 | 100 | 333 |
| E8 | First bonding layer | G6 | 60 | ZWP | 40 | 42 | 361 |
|  | Second bonding layer | G6 | 60 | ZWP | 40 | 42 | 361 |
| E9 | First bonding layer | G6 | 60 | ZWP | 40 | 42 | 361 |
|  | Second bonding layer | G6 | 75 | ZWP | 25 | 67 | 359 |
| E10 | First bonding layer | G6 | 60 | ZWP | 40 | 42 | 361 |
|  | Second bonding layer | G6 | 90 | ZWP | 10 | 88 | 358 |
| E11 | First bonding layer | G6 | 60 | ZWP | 40 | 42 | 361 |
|  | Second bonding layer | G6 | 100 | — | — | 102 | 354 |
| E12 | First bonding layer | G9 | 70 | ZWP | 30 | 50 | 365 |
|  | Second bonding layer | G6 | 100 | — | — | 102 | 354 |
| E13 | First bonding layer | G6 | 60 | ZWP | 40 | 42 | 361 |
|  | Second bonding layer | G9 | 100 | — | — | 89 | 357 |
| E14 | First bonding layer | G6 | 60 | ZWP | 40 | 42 | 361 |
|  | Second bonding layer | G10 | 100 | — | — | 111 | 360 |
| E15 | First bonding layer | G6 | 60 | ZWP | 40 | 42 | 361 |
|  | Second bonding layer | G11 | 70 | ZWP | 30 | 62 | 359 |
| E16 | First bonding layer | G6 | 60 | ZWP | 40 | 42 | 361 |
|  | Second bonding layer | G12 | 70 | ZWP | 30 | 113 | 350 |
| E17 | First bonding layer | G13 | 60 | ZWP | 40 | 50 | 362 |
|  | Second bonding layer | G6 | 90 | ZWP | 10 | 88 | 358 |
| E18 | First bonding layer | G6 | 60 | ZWP | 40 | 42 | 361 |
|  | Second bonding layer | G13 | 100 | — | — | 108 | 352 |

TABLE 3

| Comparative example | Configuration | Glass Type | Content [vol %] | Filler material Type | Content [vol %] | Thermal expansion coefficient [$10^{-7}/°C$] | Softening point [°C] |
|---|---|---|---|---|---|---|---|
| C1 | First bonding layer | G1 | 90 | ZWP | 10 | 49 | 550 |
|  | Second bonding layer | G1 | 70 | Al | 30 | 97 | 550 |
| C2 | First bonding layer | G1 | 100 | — | — | 58 | 548 |
|  | Second bonding layer | G1 | 70 | Al | 30 | 97 | 550 |
| C3 | First bonding layer | G2 | 70 | ZWP | 30 | 48 | 450 |
|  | Second bonding layer | G3 | 90 | ZWP | 10 | 90 | 442 |
| C4 | First bonding layer | G2 | 70 | ZWP | 30 | 48 | 450 |
|  | Second bonding layer | G8 | 75 | CRD | 25 | 105 | 450 |
| C5 | First bonding layer | G5 | 90 | ZWP | 10 | 89 | 365 |
|  | Second bonding layer | G4 | 70 | ZWP | 30 | 56 | 381 |
| C6 | First bonding layer | G6 | 90 | ZWP | 10 | 88 | 358 |
|  | Second bonding layer | G6 | 60 | ZWP | 40 | 42 | 361 |
| C7 | First bonding layer | G6 | 75 | ZWP | 25 | 67 | 361 |
|  | Second bonding layer | G6 | 60 | ZWP | 40 | 42 | 359 |
| C8 | First bonding layer | G7 | 70 | ZWP | 30 | 100 | 333 |
|  | Second bonding layer | G6 | 60 | ZWP | 40 | 42 | 359 |
| C9 | First bonding layer | G6 | 75 | ZWP | 25 | 67 | 361 |
|  | Second bonding layer | G5 | 70 | ZWP | 30 | 60 | 366 |
| C10 | First bonding layer | G3 | 90 | ZWP | 10 | 90 | 442 |
|  | Second bonding layer | G3 | 90 | ZWP | 10 | 90 | 442 |
| C11 | First bonding layer | G8 | 75 | CRD | 25 | 450 | 361 |
|  | Second bonding layer | G8 | 75 | CRD | 25 | 450 | 354 |

TABLE 4

| Example | Bonding temperature [°C] | Adhesion propriety | Reliability | Chip operation |
|---|---|---|---|---|
| E1 | 400 | ○ | ○ | ○ |
| E2 | 400 | ○ | ○ | ○ |
| E3 | 400 | ○ | Δ | ○ |
| E4 | 400 | Δ | Δ | ○ |
| E5 | 400 | ○ | Δ | ○ |
| E6 | 400 | ○ | Δ | ○ |
| E7 | 400 | ○ | ○ | ○ |
| E8 | 400 | ○ | Δ | ○ |
| E9 | 400 | ○ | ○ | ○ |
| E10 | 400 | ○ | ○ | ○ |

TABLE 4-continued

| Example | Bonding temperature [° C.] | Adhesion propriety | Reliability | Chip operation |
|---|---|---|---|---|
| E11 | 400 | ○ | ○ | ○ |
| E12 | 400 | ○ | ○ | ○ |
| E13 | 400 | ○ | ○ | ○ |
| E14 | 400 | Δ | ○ | ○ |
| E15 | 400 | ○ | Δ | ○ |
| E16 | 400 | Δ | ○ | ○ |
| E17 | 400 | ○ | ○ | ○ |
| E18 | 400 | ○ | ○ | ○ |

TABLE 5

| Example | Bonding temperature [° C.] | Adhesion propriety | Reliability | Chip operation |
|---|---|---|---|---|
| C1 | 600 | ○ | ○ | x |
| C2 | 600 | ○ | Δ | x |
| C3 | 490 | ○ | ○ | x |
| C4 | 490 | ○ | ○ | x |
| C5 | 400 | x | — | — |
| C6 | 400 | x | — | — |
| C7 | 400 | Δ | x | — |
| C8 | 400 | x | x | — |
| C9 | 400 | Δ | Δ | — |
| C10 | 490 | ○ | x | — |
| C11 | 490 | x | x | — |

The adhesion propriety shown in Tables 4 and 5 is evaluated as good (o) when the semiconductor chip can be bonded to the base via a bonding body in all of a plurality of samples. Among the plurality of samples, there are samples in which the semiconductor chip cannot be bonded to the base via the bonding body. However, the case where a large number of samples with no problem are included is evaluated as pass (Δ) and the case where cracking or peeling of the semiconductor chip occurs and the semiconductor chip cannot be bonded to the base is evaluated as fail (x).

The reliability shown in Tables 4 and 5 is evaluated by performing a temperature cycle test of −40° C. to 150° C. and a shear strength test on the semiconductor chip and the base bonded via the bonding layer. As a result, the case where no problem occurs in all the samples is evaluated as good (o). Depending on the sample, cracking or peeling of the semiconductor chip occurs or the bonding strength varies largely. However, the case where a large number of samples with no problem are included is evaluated as pass (Δ) and the case where cracking or peeling of the semiconductor chip occurs in a large number of samples or the case where the bonding strength becomes 10 Mpa or less is evaluated as fail (x).

The evaluation of the chip operation shown in Tables 4 and 5 is performed by manufacturing the physical quantity measurement device according to the embodiment shown in FIG. 1 by using the semiconductor chip bonded to the diaphragm functioning as the base via each bonding layer and evaluating the operation of the strain detection element to be the semiconductor chip. As a result, the case where the operation failure of the physical quantity measurement device is less than 1% is evaluated as good (o), the case where the operation failure of the physical quantity measurement device is less than 10% is evaluated as pass (Δ), and the case where the operation failure of the physical quantity measurement device is 50% or more is evaluated as fail (x).

From the above results, in the physical quantity measurement devices using the bonding layers of the examples E1 to E18 in which the thermal expansion coefficient of the first bonding layer is equal to or lower than the thermal expansion coefficient of the second bonding layer, the softening point of the first bonding layer is equal to or lower than the heat resistant temperature (for example, 430° C.) of the semiconductor chip, and the softening point of the second bonding layer is equal to or lower than the softening point of the first bonding layer, bonding reliability between the base and the semiconductor chip and operation reliability of the semiconductor chip can be improved as compared with the comparative examples C1 to C11.

At this time, the thermal expansion coefficient of the first bonding layer is preferably $42 \times 10^{-7}/°$ C. to $62 \times 10^{-7}/°$ C. and the thermal expansion coefficient of the second bonding layer is preferably $42 \times 10^{-7}/°$ C. to $113 \times 10^{-7}/°$ C. In particular, when the thermal expansion coefficient of the first bonding layer is $42 \times 10^{-7}/°$ C. to $50 \times 10^{-7}/°$ C. and the thermal expansion coefficient of the second bonding layer is $67 \times 10^{-7}/°$ C. to $102 \times 10^{-7}/°$ C., a physical quantity measurement device excellent in both a bonding state and bonding reliability between the semiconductor chip and the base is obtained.

In the examples in which the excellent result has been obtained, a relation of thermal expansion coefficients a satisfies a relation of $\alpha 1 < \alpha 2 < \alpha 3 < \alpha 4 < \alpha 5$, when the thermal expansion coefficients of the strain detection element is set to $\alpha 1$, the thermal expansion coefficient of the bonding layer of the top surface is set to $\alpha 2$, the thermal expansion coefficient of the insulating base material is set to $\alpha 3$, the thermal expansion coefficient of the bonding layer of the bottom surface is set to $\alpha 4$, and the thermal expansion coefficient of the diaphragm is set to $\alpha 5$.

As a filler content of the bonding layer, when the top surface of the bonding material is 30 to 40 vol % and the bottom surface thereof is 0 to 40 vol %, an excellent result is obtained. In particular, an excellent result is obtained when the content of the filler material of the first bonding layer is larger than the content of the filler material of the second bonding layer.

As for the glass composition, in the composition of the glass contained in the first bonding layer, $V_2O_5$ is in a range of 40 to 50 wt %, $TeO_2$ is in a range of 20 to 30 wt %, $P_2O_5$ is in a range of 5.8 to 15 wt %, $Fe_2O_3$ is in a range of 0 to 15 wt %, $WO_3$ is in a range of 0 to 10 wt %, and ZnO is in a range of 0 to 10 wt % and in the composition of the glass contained in the second bonding layer, $V_2O_5$ is in a range of 37.2 to 50 wt %, $TeO_2$ is in a range of 20 to 30 wt %, $P_2O_5$, is in a range of 0 to 15 wt %, $Fe_2O_3$ is in a range of 0 to 15 wt %, $WO_3$ is in a range of 0 to 10 wt %, BaO is in a range of 0 to 26 wt %, and ZnO is in a range of 0 to 10 wt %. In addition, alkali metal oxides such as $K_2O$ and $Cs_2O$ are contained as other components, within a range of 0 to 5 wt %.

Furthermore, when the softening point of the second bonding layer is lower than the softening point of the first bonding layer by 7° C. or more, warping of the bonding layer is small. It is thought that this is due to the fixing temperature of the glass, but this turns out to be more preferable from the viewpoint of handling of the bonding layer.

Next, similar to the examples E1 to E18, the bonding layers of the examples E19 to E21 are manufactured and an influence on the semiconductor chip by the bonding temperatures of the bonding layers is examined. In the bonding layer of the example E21, commercially available lead-based glass paste (manufactured by AGC, for 430° C. bonding, and a thermal expansion coefficient of $72 \times 10^{-7}/°$ C.) is used as a material of the second bonding layer. Configurations of the first bonding layer and the second bonding layer of each bonding layer are shown in the following Table 6.

bonding or an abnormal operation of the semiconductor chip is found. Therefore, the bonding temperature of the bonding layer is preferably equal to or lower than the heat resistant temperature of the semiconductor chip. The bonding temperature of the bonding layer is a temperature equal to or higher than the softening point of the first bonding layer of

TABLE 6

| Example | Configuration | Glass Type | Glass Content [vol %] | Filler material Type | Filler material Content [vol %] | Thermal expansion coefficient [$10^{-7}/°$ C.] | Softening point [° C.] |
|---|---|---|---|---|---|---|---|
| E19 | First bonding layer | G4 | 65 | ZWP | 35 | 47 | 382 |
|  | Second bonding layer | G5 | 90 | ZWP | 10 | 89 | 365 |
| E20 | First bonding layer | G6 | 60 | ZWP | 40 | 42 | 361 |
|  | Second bonding layer | G6 | 90 | ZWP | 10 | 88 | 358 |
| E21 | First bonding layer | G4 | 65 | ZWP | 35 | 47 | 382 |
|  | Second bonding layer | Commercially available PbO-based glass paste |  |  |  | 72 | — |

A physical quantity measurement device in which a bonding temperature when the semiconductor chip is bonded to the base is set to 430° C. and a physical quantity measurement device in which the bonding temperature is set to 450° C. are manufactured using each bonding layer shown in Table 6 and an influence on the semiconductor chip by the bonding temperature of the bonding layer is verified. Results are shown in Table 7.

TABLE 7

| Example | Bonding temperature [° C.] | Adhesion propriety | Reliability | Chip operation |
|---|---|---|---|---|
| E19 | 430 | ○ | ○ | Δ |
|  | 450 | x | — | — |
| E20 | 430 | ○ | ○ | Δ |
|  | 450 | ○ | ○ | x |
| E21 | 430 | ○ | ○ | Δ |
|  | 450 | x | — | — |

Adhesion propriety, reliability, and a chip operation of each bonding layer shown in Table 7, reliability, and evaluation of chip operation are evaluated in the same manner as each bonding layer shown in Tables 4 and 5. From the above results, if the bonding temperature of the bonding layer is equal to or lower than the heat resistant temperature (for example, 430° C.) of the semiconductor chip, a bonding state and bonding reliability are good (o) and the chip operation is pass (Δ). On the other hand, if the bonding temperature of the bonding layer exceeds the heat resistant temperature of the semiconductor chip, a problem occurs in the bonding layer or a temperature higher than the softening point of the first bonding layer.

Next, to verify an influence of the insulating base material of the bonding layer, the bonding layers of the examples E22 to E33 are manufactured in the same manner as the example E10, except for the configuration of the insulating base material. Using each manufactured bonding layer, a physical quantity measurement device is manufactured.

In addition, the bonding layer of the comparative example C12 having the first bonding layer and the second bonding layer as in the example E10 and not having the insulating base material is manufactured. Specifically, first, the glass paste for forming the second bonding layer is applied to the diaphragm to be the base, dried, and pre-baked. Then, the glass paste for forming the first bonding layer is applied to the pre-baked second bonding layer, dried, and pre-baked. Then, the semiconductor chip is disposed on the pre-baked first bonding layer and heated at 400° C. As a result, the semiconductor chip is bonded to the base via the bonding layer of the comparative example C12 and a physical quantity measurement device is manufactured.

Then, the bonding layers of the examples E22 to E33 and the comparative example C12 are evaluated in the same manner as the examples E1 to E21. Evaluation results of the configuration of the insulating base material, the bonding temperature, the bonding propriety, the reliability, and the chip operation of the bonding layer of each of the examples E22 to E33 and the comparative example C12 are shown in the following Table 8.

TABLE 8

| Example Comparative example | Insulating base material Material | Thickness [μm] | Thermal expansion coefficient [$10^{-7}/°$ C.] | Bonding temperature [° C.] | Adhesion propriety | Reliability | Chip operation |
|---|---|---|---|---|---|---|---|
| E22 | Glass | 5 | 66 | 400 | Δ | Δ | ○ |
| E23 | Glass | 20 | 66 | 400 | ○ | ○ | ○ |
| E24 | Glass | 100 | 66 | 400 | ○ | ○ | ○ |
| E25 | Glass | 300 | 66 | 400 | ○ | ○ | ○ |
| E26 | Glass | 500 | 66 | 400 | ○ | ○ | ○ |
| E27 | Glass | 30 | 38 | 400 | Δ | Δ | ○ |
| E28 | Glass | 30 | 72 | 400 | ○ | ○ | ○ |

TABLE 8-continued

| Example Comparative example | Insulating base material | | | Bonding temperature [° C.] | Adhesion propriety | Reliability | Chip operation |
|---|---|---|---|---|---|---|---|
| | Material | Thickness [μm] | Thermal expansion coefficient [$10^{-7}$/° C.] | | | | |
| E29 | Glass | 30 | 84 | 400 | ○ | ○ | ○ |
| E30 | Glass | 30 | 100 | 400 | Δ | Δ | ○ |
| E31 | Si | 50 | 37 | 400 | Δ | Δ | ○ |
| E32 | Si | 100 | 37 | 400 | Δ | Δ | ○ |
| E33 | Alumina | 100 | 73 | 400 | ○ | ○ | ○ |
| C12 | — | | | 400 | Δ | Δ | X |

In Table 8, SiO$_2$-based glass using SiO as a main component is used as the glass to be the material of the insulating base material. In addition, undoped pure Si is used as Si to be the material of the insulating base material. As shown in Table 8, it is confirmed that the abnormal operation of the semiconductor chip is found in the physical quantity measurement device using the bonding layer of the comparative example C12 having no insulating base material, but the chip operates normally in the physical quantity measurement devices using the bonding layers of the examples E22 to E33 having the insulating base material.

In addition, it is confirmed that, in addition to the glass using SiO$_2$ as the main component, a general high-resistance material such as Si or alumina can be used as the insulating base material. It is proven that a linear thermal expansion coefficient of the insulating base material can be widely used from 38×10$^{-7}$/° C. to 100×10$^{-7}$/°. However, it is found that, from a relation of linear thermal expansion coefficients with the first and second bonding layers, a particularly preferable range is a range of 66×10$^{-7}$/° C. to 84×10$^{-7}$/° C. In addition, it is found that the thickness of the insulating base material can also be widely used from about 5 μm to 500 μm, but the particularly preferable thickness is 20 μm or more from the viewpoint of reliability. However, if the thickness of the insulating base material increases, an output of the physical quantity measurement device is reduced, so that the particularly preferable thickness of the insulating base material is 20 μm to 100 μm.

Finally, an effect of a metal film formed on he surface to which the bonding layer of the base is bonded is verified. Specifically, the diaphragm made of stainless steel (SUS630) is used as the base, a pretreatment such as Ni plating and Al sputtering is performed on the bonding surface of the base to which the bonding layer is bonded, and the metal film is formed. In addition, the physical quantity measurement device is manufactured using the bonding layers of the examples E1 to E18. As a result, it is found that the shear bonding strength is improved in all of the bonding layers of the examples E1 to E18. Therefore, it is preferable to perform the pretreatment on the bonding surface of the base to form a metal film containing at least one selected from the group consisting of Al, Ni, and Mo.

REFERENCE SIGNS LIST

10 metal casing (base)
20 bonding layer
21 first bonding layer
22 second bonding layer
23 insulating base material
30 strain detection element (semiconductor chip)
100 physical quantity measurement element
200 physical quantity measurement device
S21 first disposing step
S31 first bonding step
S22 second disposing step
S32 second bonding step

The invention claimed is:

1. A physical quantity measurement device that includes a base, a semiconductor chip to measure a physical quantity on the basis of stress acting on the base, and a bonding layer to bond the semiconductor chip to the base, wherein
the bonding layer has a first bonding layer bonded to the semiconductor chip, a second bonding layer bonded to the base, and an insulating base material disposed between the first bonding layer and the second bonding layer,
the first bonding layer and the second bonding layer contain glass,
a thermal expansion coefficient of the first bonding layer is equal to or lower than a thermal expansion coefficient of the second bonding layer,
a softening point of the first bonding layer is equal to or lower than a heat resistant temperature of the semiconductor chip, and
a softening point of the second bonding layer is equal to or lower than the softening point of the first bonding layer.

2. The physical quantity measurement device according to claim 1, wherein the glass contains vanadium.

3. The physical quantity measurement device according to claim 2, wherein
the glass contained in the first bonding layer contains V$_2$O$_5$ of 40 to 50 wt %, TeO$_2$ of 20 to 30 wt %, P$_2$O$_5$ of 5.8 to 15 wt %, Fe$_2$O$_3$ of 0 to 15 wt %, WO$_3$ of 0 to 10 wt %, and ZnO of 0 to 10 wt %, and
the glass contained in the second bonding layer contains V$_2$O$_5$ of 37.2 to 50 wt %, TeO$_2$ of 20 to 30 wt %, P$_2$O$_5$ of 0 to 15 wt %, Fe$_2$O$_3$ of 0 to 15 wt %, WO$_3$ of 0 to 10 wt %, BaO of 0 to 26 wt %, ZnO of 0 to 10 wt %, and an alkali metal oxide of 0 to 5 wt %.

4. The physical quantity measurement device according to claim 1, wherein
the first bonding layer and the second bonding layer contain a filler material having a thermal expansion coefficient lower than a thermal expansion coefficient of the glass, and
a content of the filler material in the first bonding layer is higher than a content of the filler material in the second bonding layer.

5. The physical quantity measurement device according to claim 4, wherein the content of the filler material in the first bonding layer is 30 vol % to 40 vol %.

6. The physical quantity measurement device according to claim 1, wherein a thermal expansion coefficient of the insulating base material is $38 \times 10^{-7}/°$ C. to $100 \times 10^{-7}/°$ C.

7. The physical quantity measurement device according to claim 1, wherein a material of the insulating base material is Glass, silicon, or alumina.

8. The physical quantity measurement device according to claim 1, wherein a thickness of the insulating base material is 5 μm to 500 μm.

9. The physical quantity measurement device according to claim 1, wherein each of the base and the semiconductor chip has a metal film containing at least one selected from the group consisting of Al, Ni, Ti, and Mo, on a surface to which the bonding layer is bonded.

10. A method for manufacturing a physical quantity measurement device that includes a base, a semiconductor chip to measure a physical quantity on the basis of stress acting on the base, and a bonding layer to bond the semiconductor chip to the base, the method comprising:
   a first disposing step of disposing the semiconductor chip and a first bonding layer of the bonding layer to face each other using the bonding layer, which includes the first bonding layer and a second bonding layer containing glass and an insulating base material disposed between the first bonding layer and the second bonding layer, and in which a thermal expansion coefficient of the first bonding layer is equal to or lower than a thermal expansion coefficient of the second bonding layer, a softening point of the first bonding layer is equal to or lower than a heat resistant temperature of the semiconductor chip, and a softening point of the second bonding layer is equal to or lower than the softening point of the first bonding layer;
   a first bonding step of bonding the semiconductor chip and the bonding layer via the first bonding layer by heating the bonding layer to a temperature equal to or higher than the softening point of the first bonding layer and equal to or lower than the heat resistant temperature of the semiconductor chip;
   a second disposing step of disposing the base and the second bonding layer of the bonding layer to face each other; and
   a second bonding step of bonding the base and the bonding layer via the second bonding layer by heating the bonding layer to a temperature equal to or higher than the softening point of the second bonding layer and equal to or lower than the heat resistant temperature of the semiconductor chip.

11. The method for manufacturing the physical quantity measurement device according to claim 10, wherein after the first disposing step and the second disposing step are performed to dispose the bonding layer between the semiconductor chip and the base, the bonding layer is heated to the temperature equal to or higher than the softening point of the first bonding layer and equal to or lower than the heat resistant temperature of the semiconductor chip, and the first bonding step and the second bonding step are collectively performed.

12. A physical quantity measurement element that includes a semiconductor chip to measure a physical quantity on the basis of stress acting on a base and a bonding layer to bond the semiconductor chip to the base, wherein
   the bonding layer has a first bonding layer bonded to the semiconductor chip, a second bonding layer bonded to the base, and an insulating base material disposed between the first bonding layer and the second bonding layer,
   the first bonding layer and the second bonding layer contain glass,
   a thermal expansion coefficient of the first bonding layer is equal to or lower than a thermal expansion coefficient of the second bonding layer,
   a softening point of the first bonding layer is equal to or lower than a heat resistant temperature of the semiconductor chip, and
   a softening point of the second bonding layer is equal to or lower than the softening point of the first bonding layer.

* * * * *